(12) United States Patent
Meng et al.

(10) Patent No.: US 9,670,362 B2
(45) Date of Patent: Jun. 6, 2017

(54) THERMOSET RESIN COMPOSITION, AND PREPREG AND LAMINATE FOR PRINTED CIRCUIT BOARD MANUFACTURED THEREFROM

(75) Inventors: Yundong Meng, Guangdong (CN); Kehong Fang, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 155 days.

(21) Appl. No.: 14/367,337

(22) PCT Filed: Dec. 29, 2011

(86) PCT No.: PCT/CN2011/084885
§ 371 (c)(1),
(2), (4) Date: Jun. 20, 2014

(87) PCT Pub. No.: WO2013/097133
PCT Pub. Date: Jul. 4, 2013

(65) Prior Publication Data
US 2015/0159016 A1    Jun. 11, 2015

(51) Int. Cl.
*C08L 79/00* (2006.01)
*C08L 63/00* (2006.01)
*C08L 71/12* (2006.01)
*C08J 5/24* (2006.01)
*C08K 5/5313* (2006.01)

(52) U.S. Cl.
CPC ............. *C08L 79/00* (2013.01); *C08J 5/24* (2013.01); *C08L 63/00* (2013.01); *C08L 71/12* (2013.01); *C08L 71/126* (2013.01); *C08J 2363/00* (2013.01); *C08J 2371/12* (2013.01); *C08J 2379/00* (2013.01); *C08J 2463/00* (2013.01); *C08J 2471/12* (2013.01); *C08J 2479/00* (2013.01); *C08K 5/5313* (2013.01); *C08L 2201/02* (2013.01); *C08L 2205/03* (2013.01); *H05K 2201/029* (2013.01); *H05K 2201/0293* (2013.01); *Y10T 428/31522* (2015.04); *Y10T 442/20* (2015.04)

(58) Field of Classification Search
CPC .......... C08L 79/00; C08L 63/00; C08L 71/12; C08L 71/126
See application file for complete search history.

(56) References Cited

U.S. PATENT DOCUMENTS

| | | | | |
|---|---|---|---|---|
| 4,837,276 A * | 6/1989 | Fuhr | ................... | C08G 65/485 524/125 |
| 8,889,816 B2 * | 11/2014 | Meng | ..................... | C08G 65/48 525/390 |
| 2006/0167189 A1 * | 7/2006 | Mizuno | ................. | B32B 15/08 525/396 |
| 2008/0166511 A1 * | 7/2008 | Honma | ................. | C08G 59/50 428/36.4 |
| 2009/0004484 A1 * | 1/2009 | Kim | ..................... | B32B 15/14 428/436 |
| 2010/0218982 A1 * | 9/2010 | Fujiwara | ............ | C08G 59/4014 174/257 |
| 2010/0292376 A1 * | 11/2010 | Timberlake | .......... | C08K 5/5397 524/129 |
| 2011/0048776 A1 * | 3/2011 | Qiang | ................... | B32B 15/20 174/258 |

FOREIGN PATENT DOCUMENTS

| | | |
|---|---|---|
| CN | 1938358 | 3/2007 |
| CN | 102181143 | 9/2011 |
| CN | 102181143 A | 9/2011 |
| CN | 102206397 | 10/2011 |
| CN | 102206415 | 10/2011 |
| CN | 102585480 | 7/2012 |

(Continued)

OTHER PUBLICATIONS

CN 102181143 English Machine Translation. Translated Jan. 12, 2016.*
Aasahi Kasei Corporation, PolySource, Xyron S201A Polyphenylene Ether, 2016, one page.*
Chinese Abstract of CN102585480, Thermosetting resin composition, prepreg prepared from composition, and laminated board prepared from composition and used for printed circuit board, Shengyi Technology Co. Ltd., Jul. 18, 2012.

(Continued)

*Primary Examiner* — Margaret Moore
(74) *Attorney, Agent, or Firm* — McDonald Hopkins LLC

(57) ABSTRACT

The present invention relates to a thermoset resin composition, and a prepreg and a laminate for a printed circuit board manufactured therefrom. The thermoset resin composition comprises the following components: a phosphorus-containing polyphenyl ether resin having low molecular weight, an epoxy resin, a cyanate resin and an accelerator. The prepreg manufactured using the resin composition comprises a base material and the thermoset resin composition adhered to the base material by impregnation and drying. The laminate for a printed circuit board manufactured using the resin composition comprises a plurality of laminated prepregs, a metal foil covering one or two faces of the laminated prepregs by pressing, with each prepreg comprising a base material and the thermoset resin composition adhered to the base material by impregnation and drying. The thermoset resin composition of the present invention has properties such as a low dielectric constant and a dielectric dissipation factor, high heat resistance, a high glass transition temperature, and flame retardancy, etc. The laminates for a printed circuit board manufactured using same have excellent metal foil peel strength, heat resistance and dielectric properties, and are suitable for high frequency and high speed electronic circuit boards.

8 Claims, No Drawings

(56) References Cited

FOREIGN PATENT DOCUMENTS

| EP | 0275545 A1 | | 7/1988 |
|---|---|---|---|
| JP | 2010-53179 A | * | 3/2010 |
| WO | 2010109948 A1 | | 9/2010 |

OTHER PUBLICATIONS

Chinese Abstract of CN102181143, High-frequency thermosetting resin composition, prepreg and laminated sheet, Shengyi Technology Suzhou Co. Ltd., Sep. 14, 2011.
Chinese Abstract of CN1938358, Resin composition, metal foil with resin, insulating sheet with base material and multilayer printed wiring board, Sumitomo Bakelite Co., Mar. 28, 2007.
Chinese Abstact of CN102206415, Resin composition, and prepreg, laminate and circuit board containing the composition, Elite Material Co., Oct. 5, 2011.
Chinese Abstract of CN102206397, Resin composition as well as semi-solidified rubber sheet, laminating board and circuit board containing same, Elite Material Co., Oct. 5, 2011.
European Search Report for App. No. 11878850.4, dated Nov. 23, 2015.

\* cited by examiner

THERMOSET RESIN COMPOSITION, AND PREPREG AND LAMINATE FOR PRINTED CIRCUIT BOARD MANUFACTURED THEREFROM

FIELD OF THE INVENTION

The present invention relates to a resin composition, especially to a thermoset resin composition, and a prepreg and a laminate for printed circuit board manufactured therefrom.

BACKGROUND OF THE INVENTION

Currently, electrical and electronic industry is rapidly developing, and the development direction of electronic products develop is of lightness and thinness, high performance, high reliability, environment friendliness, etc. The specific requirements for electronic circuit boards are embodied as high heat resistance, low coefficient of thermal expansion, high moisture-heat resistance, environmentally protective flame retardancy, low dielectric constant and dielectric dissipation, and high elasticity modulus etc. Hence, traditional epoxy resins can not completely meet the demands for the development of electronic circuit boards; the use of polyphenyl ether resins with high heat resistance, low dielectric constant, low dielectric dissipation, good tenacity are more and more outstanding. However, traditional polyphenyl ether resins still have disadvantage in the aspect of processing due to the excessively high molecular weight thereof.

Due to the problem of environmental pollution and the like produced by halogen flame retardancy, currently phosphorus-containing compounds such as phosphorus-containing phenanthrene type compound DOPO and derivatives thereof are generally employed to achieve flame retardant effect in industry. At present the halogen-free polyphenyl ether resin composition used in electronic circuit boards usually employs an addictive-type phosphorus-containing flame retardant to achieve the flame retardant requirement, but it still has disadvantage in the aspect of moisture-heat resistance and chemical resistance, etc.

SUMMARY OF THE INVENTION

An object of the present invention is providing a thermoset resin composition, which has properties of low dielectric constant and low dielectric dissipation, high heat resistance, flame retardancy, low water absorption, high glass transition temperature, low coefficient of thermal expansion, etc. and is suitable for the manufacture of prepregs and laminates for printed circuit board.

Another object of the present invention is providing a prepreg manufactured by using the thermoset resin composition above, which has properties of a low dielectric constant, low dielectric dissipation, high heat resistance, flame retardancy, low water absorption, a high glass transition temperature, low coefficient of thermal expansion, etc.

A further object of the present invention is providing a laminate for printed circuit board manufactured by using the thermoset resin composition above, which has excellent metal foil peel strength, heat resistance and dielectric properties and is suitable for high frequency and high speed electronic circuit boards.

In order to achieve the objects above, the present invention provides a thermoset resin composition, comprising the following parts by weight of the following components: 100 parts by weight of a phosphorus-containing polyphenyl ether resin having low molecular weight, 10-300 parts by weight of an epoxy resin, 10-300 parts by weight of a cyanate resin and 0.01-1.0 parts by weight of an accelerator.

The polyphenyl ether having low molecular weight is a phosphorus-containing polyphenyl ether resin having low molecular weight of the number-average molecular weight of 1000-6000 which is obtained by redistribution reaction of a raw material polyphenyl ether having the number average molecular weight larger than 10000 with a phosphorus-containing phenolic compound suspended in the solution in the presence of an initiator.

The phosphorus-containing phenolic compound is a phosphorus-containing phenolic compound having one or two or more phenolic hydroxyl groups.

The initiator is one selected from the group consisting of dicumyl peroxide, tert-butyl cumyl peroxide, ditert-butyl peroxide, tert-butyl peroxy isopropyl carbonate, 2,5-dimethyl-2,5-ditert-butylcumylperoxy hexyne-3,2,5-dimethyl 2,5-ditert-butylperoxy hexane, p-menthane peroxide, 1,1-bis(tert-amylperoxy) cyclohexane, diisopropylbenzene hydroperoxide, benzoyl peroxide and benzoyl peroxide derivatives or combination thereof.

The epoxy resin is one selected from the group consisting of halogen-free and phosphorus-free bisphenol A-type, biphenol F-type, bisphenol S-type epoxy resins and epoxy resins comprising a structure such as dicyclopentadiene, benzene, naphthalene, biphenyl, alicyclic, cresol novolac, isocyanate, hydantoin, etc., or combination thereof; the cyanate resin is one selected from the group consisting of aromatic cyanate compounds like 2,2-bis(4-cyanatophenyl) propane, bis(3,5-dimethyl-4-cyanatophenyl) methane, 2,2-bis(4-cyanatophenyl) ethane, or its derivatives, or combination thereof; the accelerator is one selected from the group consisting of 2-methyl imidazole, 2-phenyl imidazole, 2-ethyl-4-methyl imidazole, tributylamine, triphenyl phosphine, boron trifluoride complex, octoates of zinc, copper, iron, tin, cobalt, aluminum, acetylacetone, naphthenic acids, salicylic acid, stearate, or combination thereof.

A phosphorus-containing flame retardant can also be comprised, the content of which is 5-80 parts by weight based on 100 parts by weight of the total solid matters of the thermoset resin composition. The phosphorus-containing flame retardant includes one selected from the group consisting of condensed phosphate, phosphazene compound flame retardants, or combination thereof.

An inorganic packing can also be comprised, the amount of which is 5-300 parts by weight based on 100 parts by weight of the total solid matters of the thermoset resin composition. The inorganic packing is one selecting from the group consisting of silica, boron nitride, aluminum hydroxide, boehmite, talcum, clay, mica, kaolin, barium sulfate, calcium carbonate, magnesium hydroxide, zinc borate, or combination thereof.

Further, the present invention provides a prepreg manufactured by using the thermoset resin composition above, comprising a base material and the thermoset resin composition adhered to the base material by impregnation and drying.

The base material is a fabric or a non-woven fabric.

Additionally, the present invention also provides a laminate for printed circuit board manufactured by using the thermoset resin composition above, comprising a plurality of laminated prepregs, a metal foil covering one or two faces of the laminated prepregs by pressing, with each prepreg comprising a base material and the thermoset resin composition adhered to the base material by impregnation and drying.

The present invention has the following beneficial effects. The present invention employs a phosphorus-containing polyphenyl ether resin having low molecular weight, which not only has good processability but also contributes to enhance flame retardancy and meets the flame retardant requirement. The thermoset resin composition prepared by combining the polyphenyl ether resin with an epoxy resin and a cyanate resin has low dielectric constant, low dielectric dissipation factor, high heat resistance, high glass transition temperature and flame retardancy, etc. The prepreg manufactured by using the thermoset resin composition has low dielectric constant, low dielectric dissipation factor, high heat resistance, high glass transition temperature, low water absorption and flame retardancy, etc.; the laminates for printed circuit board manufactured by using the thermoset resin composition have excellent metal foil peel strength, heat resistance and dielectric properties, and are suitable for high frequency and high speed electronic circuit boards.

DETAILED DESCRIPTION OF THE INVENTION

The thermoset resin composition of the present invention substantially comprises the following parts by weight of the following components: 100 parts by weight of a phosphorus-containing polyphenyl ether resin having low molecular weight, 10-300 parts by weight of an epoxy resin, 10-300 parts by weight of a cyanate resin and 0.01-1.0 parts by weight of an accelerator.

Based on the problems existing in the prior art, as studying the redistribution reaction of polyphenyl resins, the applicant has found that dispersing phosphorus-containing phenolic compounds in the raw material polyphenyl ether solution can also conduct a redistribution reaction under the effect of the initiator, thereby obtaining a phosphorus-containing polyphenyl ether resin having low molecular weight. The phosphorus-containing polyphenyl ether resin having low molecular weight not only has better processability but also contributes to enhance flame retardancy. The thermoset resin composition prepared by combining the polyphenyl ether resin with a thermoset resin such as an epoxy resin, a cyanate resin and the like has properties of low dielectric constant, low dielectric dissipation factor, high heat resistance, etc. also can avoid or decrease the negative effect of addictive flame retardants, and are suitable for high frequency and high speed electronic circuit boards.

Specifically, the said phosphorus-containing polyphenyl ether resin having low molecular weight is a modified polyphenyl oxide resin having low molecular weight with the number average molecular weight of 1000-6000 prepared, in the presence of an initiator, by a redistribution reaction of a raw material polyphenyl ether having a number average molecular weight larger than 10000 with a phosphorus-containing phenolic compound suspended in the reaction solution in a reaction container equipped with a condenser tube, stirring apparatus and temperature control device. The phosphorus-containing phenolic compound is a phosphorus-containing compound having one or two or more phenolic hydroxyl groups, the amount of which is 4-80 parts by weight based on 100 parts by weight of the raw material polyphenyl ether. The phosphorus-containing phenolic compound is one selected from the addition products of 9,10-Dihydro-9-oxa-10-phosphaphenanthrene 10-oxide (DOPO) with benzoquinone, 1,4-naphthoquinone, p-hydroxybenzene maleimide or rosolic acid, etc. (respectively DOPO-HQ, DOPO-NQ, DOPO-HPM or DOPO-triol, etc.) and other phosphorus-containing phenolic compounds, or combination thereof. The chemical structural formulae of DOPO-HQ, DOPO-NQ, DOPO-HPM and DOPO-triol are respectively as follows:

Formula I: DOPO-HQ

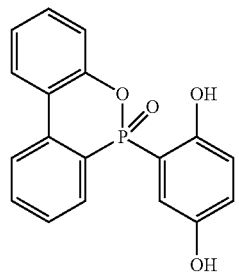

Formula II: DOPO-NQ:

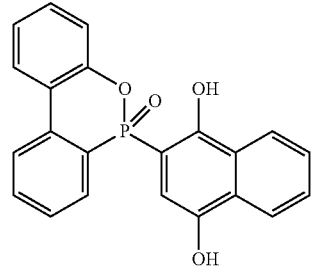

Formula III: DOPO-HPM:

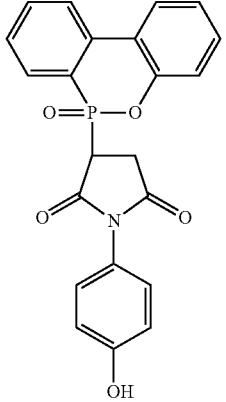

Formula IV: DOPO-triol

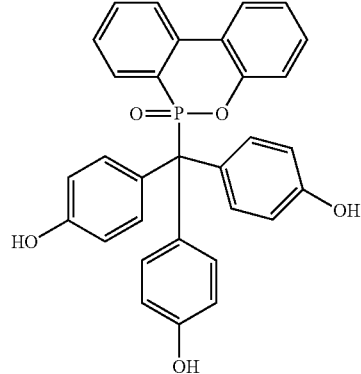

The initiator is one selected from the group consisting of perioxides like dicumyl peroxide, tert-butyl cumyl peroxide, ditert-butyl peroxide, tert-butyl peroxy isopropyl carbonate, 2,5-dimethyl-2,5-ditert-butylcumylperoxy hexyne-3,2,5-dimethyl 2,5-ditert-butylperoxy hexane, p-menthane peroxide, 1,1-bis(tert-amylperoxy) cyclohexane, diisopropylbenzene hydroperoxide, benzoyl peroxide, benzoyl peroxide derivatives, or combination thereof. A catalyst can also be used in the redistribution reaction for preparing the phosphorus-containing polyphenyl ether resin having low molecular weight in order to accelerate the efficiency of the initiator. The catalyst is one selected from the group consisting of metal salts of a naphthenic acid, vanadium pentoxide, aniline, amine compounds, quaternary ammonium salts, imidazoles and phosphonium salts, etc., or combination thereof.

In the thermoset resin composition of the present invention, the epoxy resin is one selected from the group consisting of halogen-free phosphorus-free bisphenol A-type, biphenol F-type, biphenol S-type epoxy resins and epoxy resins comprising a structure such as dicyclodiene, benzene, naphthalene, biphenyl, alicyclic, cresol novolac, isocyanate, hydantoin, etc., or combination thereof.

The cyanate resin of the present invention can be either self-polymerized or polymerized with the epoxy resin under heating. No polar structure such as hydroxyl group and the like is generated during the reaction process, which contributes to enhance the dielectric properties of the metal sheet laminate. The cyanate resin is a compound comprising more than two cyanate groups in the molecular. The cyanate resin is one or more selected from the aromatic cyanate compounds such as 2,2-bis(4-cyanatophenyl) propane, bis(3,5-dimethyl-4-cyanatophenyl) methane, 2,2-bis(4-cyanatophenyl) ethane or derivatives thereof.

The accelerator of the present invention is one selected from the group consisting of imidazole compounds, tertiary amines, organic metal salts or complexes, etc., or combination thereof; mainly is one selected from the group consisting of 2-methyl imidazole, 2-phenyl imidazole, 2-ethyl-4-methyl imidazole, tributylamine, triphenyl phosphine, boron trifluoride complex, zinc, copper, iron, tin, cobalt, aluminum octoates, acetylacetone, naphthenic acids, salicylic acid and stearate, or combination thereof.

A phosphorus-containing flame retardant may also be added to the thermoset resin composition of the present invention, which may be one or more selected from the group consisting of condensed phosphate and phosphazene compound flame retardantscombination thereof. The phosphorus-containing flame retardant mainly is able to complement the flame retardant effect of the phosphorus-containing polyphenyl ether resin having low molecular weight. The amount of the phosphorus-containing flame retardant is 5-80 parts by weight based on 100 parts by weight of the total solid matters of the thermoset resin composition above.

An inorganic packing may be added in the resin composition of the present invention to adjust the properties of the composition. The inorganic packing may be one or more selected from the group consisting of silica, boron nitride, aluminum hydroxide, boehmite, talcum, clay, mica, kaolin, barium sulfate, calcium carbonate, magnesium hydroxide, zinc borate, or combination thereof. According to the aim of use, the inorganic packing may have a proper ratio adjustment, the amount of which is 5-300 parts by weight based on 100 parts by weight of the total solid matters of the thermoset resin composition.

The abovementioned cyanate resin, accelerator, phosphorus-containing polyphenyl ether resin having low molecular weight and epoxy resin are mixed; at normal temperature a liquid solution is added. After the mix is stirred to completely dissolved, the inorganic packing is added; high speed shearing is proceeded to make the packing disperse uniformly and evenly, obtaining thermoset resin composition liquid cement with a solid content of 45-70%. The composition liquid cement is impregnated with a base material followed by baking for 2-10 min at 100-200° C., obtaining the prepreg. The base material used is a fabric or a non-woven fabric The prepreg manufactured from the thermoset resin composition of the present invention, including a base material and the thermoset resin composition adhered to the base material by impregnation and drying. The base material used is a fabric or a non-woven fabric such as natural fiber, organic synthetic fiber and inorganic fiber.

The laminate for printed circuit board of the present invention, including: a plurality of laminated prepregs, a metal foil covering one or two faces of the laminated prepregs by pressing, with each prepreg comprising a base material and the thermoset resin composition adhered to the base material by impregnation and drying. In preparation, a plurality of prepregs manufactured from the thermoset resin composition are laminated; a metal foil is covered on one or two faces thereon after laminating and pressed under a pressure of 2-5 Mpa at a temperature of 180-250° C. for 1-4 h thereby obtaining the laminate for printed circuit board. The metal foil can be copper foil, nickel foil, aluminum foil and SUS foil, etc. without restrictions and the base material is a fabric or a non-woven fabric.

With respect to the above manufactured laminate for printed circuit board, the glass transition temperature, pyrolysis temperature, peel strength, dielectric dissipation factor, dielectric constant and combustibility thereof are measured. The following examples further provide detailed explanations and descriptions.

Herein the examples of the present invention will be detailed described but the present invention should not be limited by the examples.

Example 1

50 parts by weight of polyphenyl oxide resin with the number average of 20000 (Asahi Kasei Chemistry Corporation, trade name: S201A) and 50 parts by weight of dicyclopentadiene epoxy resin (Chang Chun Plastic s CO., LTD, trade name: DNE260) were added to 120 parts by weight of toluene, mixed and heated to 90° C. to make it completely dissolve, and then 10 parts by weight of DOPO-HQ (Huizhou Sunstar Technology CO., LTD, trade name: ODOPB) were sufficiently distributed in the reaction materials. Then 8 parts by weight of BPO (DongGuan Kangxin Reagent, trade name: benzoyl peroxide) were divided into 10 aliquots and uniformly fed within 30 min, maintained at 90° C. for 90 min and then stopped heating. When cooling to around 40° C., 50 parts by weight of bisphenol A-type cyanate (Jiangdu Wuqiao Resin Factory, trade name: CY-10), 0.02 parts by weight of zinc Isoocatanoate and 30 parts by weight of phosphazene flame retardant (Huizhou Sunstar Technology CO., LTD, trade name: SPB100) were added. The mix was stirred uniformly, obtaining liquid cement. Flat and smooth model 2166 E-typed glass fiber cloth was uniformly impregnated with the liquid cement above, baked for 5 min at 170° C. in an air circulation oven to obtain a prepreg, 6 sheets of the prepreg above were laminated, covered on both faces by copper foils having a thickness of 35 μm respectively, and pressed at 220° C.

under a pressure of 3 MPa in a vacuum hot presser, obtaining a laminate for printed circuit board.

Example 2

50 parts by weight of polyphenyl oxide resin with a number average of 20000 (Asahi Kasei Chemistry Corporation, trade name: S201A) and 50 parts by weight of bisphenol A-type epoxy resin (Dow Chemical Company, trade name: D.E.R. 330) were added to 120 parts by weight of toluene, mixed and heated to 90° C. to make it completely dissolve, and then 10 parts by weight of DOPO-HQ (Huizhou Sunstar Technology CO., LTD, trade name: ODOPB) were sufficiently distributed in the reaction materials. Then 8 parts by weight of BPO (DongGuan Kangxin Reagent, trade name: benzoyl peroxide) were divided into 10 aliquots and uniformly fed within 30 min, maintained at 90° C. for 90 min and then stopped heating. When cooling to around 40° C., 50 parts by weight of bisphenol A-type cyanate (Jiangdu Wuqiao Resin Factory, trade name: CY-10), 0.02 parts by weight of zinc Isoocatanoate and 30 parts by weight of phosphazene flame retardant (Huizhou Sunstar Technology CO., LTD, trade name: SPB100) were added. The mixture was uniformly stirred, obtaining liquid cement. Flat and smooth model 2166 E-typed glass fiber cloth was uniformly impregnated with the liquid cement above, baked for 5 min at 170° C. in an air circulation oven to obtain a prepreg. 6 sheets of the prepreg above were laminated and covered on both faces by copper foils having a thickness of 35 μm respectively, and pressed at 220° C. under a pressure of 3 MPa in a vacuum hot press, obtaining a laminate for printed circuit board was prepared.

Example 3

50 parts by weight of polyphenyl oxide resin with a number average of 20000 (Asahi Kasei Chemistry Corporation, trade name: S201A) and 50 parts by weight of biphenyl epoxy resin (Nippon Kayaku, Co., Ltd., trade name: NC3000H) were added to 120 parts by weight of toluene, mixed and heated to 90° C. to make it completely dissolve, and then 10 parts by weight of DOPO-HQ (Huizhou Sunstar Technology CO., LTD, trade name: ODOPB) were sufficiently distributed in the reaction materials. Then 8 parts by weight of BPO (DongGuan Kangxin Reagent, trade name: benzoyl peroxide) were divided into 10 aliquots and uniformly fed within 30 min, maintained at 90° C. for 90 min and then stopped heating. When cooling to around 40° C., 50 parts of bisphenol A-type cyanate (Jiangdu Wuqiao Resin Factory, trade name: CY-10), 0.02 parts by weight of zinc isoocatanoate and 30 parts by weight of phosphazene flame retardant (Huizhou Sunstar Technology CO., LTD, trade name: SPB100) were added. The mixture was uniformly stirring, obtaining liquid cement. Flat and smooth model 2166 E-typed glass fiber cloth was uniformly impregnated with the liquid cement above, baked for 5 min at 170° C. in an air circulation oven to obtain a prepreg. 6 sheets of the prepreg above were laminated, covered on both faces by copper foils having a thickness of 35 μm respectively, and pressed at 220° C. under a pressure of 3 MPa in a vacuum hot press, to obtain a laminate for printed circuit board.

TABLE 1 property evaluation on the laminates for printed circuit board prepared in Examples 1-3

| | Example 1 | Example 2 | Example 3 |
|---|---|---|---|
| Glass transition temperature (Tg) ° C. | 174 | 155 | 160 |
| Thermal deposition temperature (Td) ° C. | 368 | 377 | 369 |
| Peel strength (PS) N/mm | 0.8 | 0.8 | 1.0 |
| 1 GHz dielectric constant (Dk) | 3.65 | 3.90 | 3.72 |
| 1 GHz dielectric dissipation factor (Df) | 0.0053 | 0.0054 | 0.0045 |
| Combustibility resistance | V-0 | V-0 | V-0 |

The properties above are measured by the following methods:
(1) Glass transition temperature (Tg): measured according to the differential scanning calorimetry (DSC) as stipulated under IPC-TM-650 2.4.25.
(2) Thermal deposition temperature Td: measured according to the method of IPC-TM-650 2.4.26.
(3) Peel strength (PS) was measurement of the peel strength of the metal covering layer according to the experimental condition "post thermal stress" in the method of IPC-TM-650 2.4.8.
(4) Dielectric dissipation factor: dielectric dissipation factor at 1 GHz was measured on the basis of the resonance method using strip lines according to IPC-TM-650 2.5.5.9.
(5) Combustibility resistance: measured according to UL94 vertical firing method.

Above all, the present invention employs phosphorus-containing polyphenyl ether resin having low molecular weight, which not only has good processability but also contributes to enhance flame retardancy and meets the flame retardant requirement. The thermoset resin composition prepared by combining the phosphorus-containing polyphenyl ether resin having low molecular weight with an epoxy resin and a cyanate resin has a low dielectric constant and a dielectric dissipation factor, high heat resistance, high glass transition temperature and flame retardancy, etc. The prepreg manufactured by using the thermoset resin composition has a low dielectric constant and a dielectric dissipation factor, high heat resistance, high glass transition temperature, low water absorption and flame retardancy, etc.; the laminates for a printed circuit board manufactured by using the thermoset resin composition have excellent metal foil peel strength, heat resistance and dielectric properties, and are suitable for high frequency and high speed electronic circuit boards.

The examples above do not make any restriction to the content of the composition of the present invention. All slight amendments, equivalent changes and modifications according to the technical essence, components or contents of the composition and the examples above fall into the scope of the technical solution of the present invention.

The invention claimed is:
1. A thermoset resin composition, comprising the following parts by weight of the following components: 50 parts of a phosphorus-containing polyphenyl ether resin having low molecular weight, 50 parts of an epoxy resin, 50 parts of a cyanate resin and 0.01-1.0 part of an accelerator; further comprising 30 parts by weight of phosphorus-containing flame retardant; wherein the phosphorus-containing flame retardant is a phosphazene compound flame retardant; and wherein, the phosphorus-containing polyphenyl ether having low molecular weight is a phosphorus-containing polyphenyl ether resin having low molecular weight with a number-average molecular weight of 1000-6000, which is obtained by conducting a redistribution reaction with a raw material polyphenyl ether having a number average molecular weight larger than 10000 and a phosphorus-containing phenolic compound suspended in the solution in the presence of an initiator, wherein the phosphorus-containing phenolic compound is DOPO-HQ.

2. The thermoset resin composition according to claim 1, wherein, the phosphorus-containing phenolic compound is a phosphorus-containing phenolic compound having one or two or more phenolic hydroxyl groups.

3. The thermoset resin composition according to claim 1, wherein, the initiator is one selected from the group consisting of dicumyl peroxide, tert-butyl cumyl peroxide, ditert-butyl peroxide, tert-butyl peroxy isopropyl carbonate, 2,5-dimethyl-2,5-ditert-butylcumylperoxy hexyne-3,2,5-dimethyl 2,5-ditert-butylcumylperoxy hexane, p-menthane peroxide, 1,1-bis(tert-amylperoxy) cyclohexane, diisopropylbenzene hydroperoxide, benzoyl peroxide and benzoyl peroxide derivatives or combination thereof.

4. The thermoset resin composition according to claim 1, wherein, the epoxy resin is one selected from the group consisting of halogen-free phosphorus-free bisphenol A, bisphenol F, bisphenol S epoxy resins or epoxy resins comprising a structure such as dicyclopentadiene, benzene, naphthalene, biphenyl, alicyclic, cresol novolac, isocyanate and hydantoin, etc., or combination thereof; the cyanate resin is one selected from the group consisting of aromatic cyanate compounds like 2,2-bis(4-cyanatophenyl) propane, bis(3,5-dimethyl-4-cyanatophenyl) methane and 2,2-bis(4-cyanatophenyl) ethane, or its derivatives, or combination thereof; the accelerator is one selected from the group consisting of 2-methyl imidazole, 2-phenyl imidazole, 2-ethyl-4-methyl imidazole, tributylamine, triphenyl phosphine, boron trifluoride complex, zinc, copper, iron, tin, cobalt, aluminum octoates, acetylacetone, naphthenic acids, salicylic acid and stearate, or combination thereof.

5. The thermoset resin composition according to claim 1, wherein, which further comprises 5-300 parts by weight of inorganic packing based on 100 parts by weight of the total solid matters of the thermoset resin composition; the inorganic packing is one selecting from the group consisting of silica, boron nitride, aluminum hydroxide, boehmite, talcum, clay, mica, kaolin, barium sulfate, calcium carbonate, magnesium hydroxide and zinc borate, or combination thereof.

6. A prepreg manufactured by using the thermoset resin composition according to claim 1, comprising base material and thermoset resin composition adhered to the base material after impregnation and drying.

7. The prepreg according to claim 6, wherein, the base material is a fabric or a non-woven fabric.

8. A laminate for a printed circuit board manufactured by using the thermoset resin composition according to claim 1, comprising a plurality of laminated prepregs and a metal foil covering one or both sides of the laminated prepregs by pressing, wherein each of the prepregs comprises the base material and the thermoset resin composition adhered to the base material after impregnation and drying.

* * * * *